US010749467B2

(12) United States Patent
Noto

(10) Patent No.: US 10,749,467 B2
(45) Date of Patent: Aug. 18, 2020

(54) PIEZOELECTRIC RESONATOR UNIT AND TEMPERATURE CONTROL METHOD THEREFOR, AND PIEZOELECTRIC OSCILLATOR

(71) Applicant: Murata Manufacturing Co., Ltd., Nagaokakyo-shi, Kyoto-fu (JP)

(72) Inventor: Kazuyuki Noto, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 114 days.

(21) Appl. No.: 15/950,499

(22) Filed: Apr. 11, 2018

(65) Prior Publication Data
US 2018/0234052 A1 Aug. 16, 2018

Related U.S. Application Data

(63) Continuation of application No. PCT/JP2016/073535, filed on Aug. 10, 2016.

(30) Foreign Application Priority Data

Oct. 20, 2015 (JP) .................. 2015-206667

(51) Int. Cl.
*H03B 5/04* (2006.01)
*H03B 5/32* (2006.01)
(Continued)

(52) U.S. Cl.
CPC ............. *H03B 5/04* (2013.01); *H01L 41/053* (2013.01); *H03B 1/02* (2013.01); *H03B 5/32* (2013.01);
(Continued)

(58) Field of Classification Search
CPC ........... H03L 1/028; H03L 1/022; H03L 1/04; H03B 5/32; H03B 1/02; H03B 5/04;
(Continued)

(56) References Cited

U.S. PATENT DOCUMENTS 8,085,105 B2 12/2011 Kasahara
8,754,718 B2 * 6/2014 Horie ................. H02N 2/001
331/158
(Continued)

FOREIGN PATENT DOCUMENTS

JP 2010119031 A 5/2010
JP 2013062707 A 4/2013
(Continued)

OTHER PUBLICATIONS

International Search Report issued in International Application No. PCT/JP2016/073535, dated Nov. 8, 2016.
(Continued)

*Primary Examiner* — Arnold M Kinkead
(74) *Attorney, Agent, or Firm* — Arent Fox LLP

(57) ABSTRACT

A piezoelectric resonator unit includes a base member having a mounting surface. A piezoelectric resonator is mounted on the mounting surface and a lid member is bonded to the mounting surface such that the piezoelectric resonator is hermetically sealed in an inner space. A heat conductor is connected to a temperature sensor that detects a temperature of the piezoelectric resonator and is connected to a heating element that radiates heat onto the piezoelectric resonator. The heat conductor has a portion that is arranged in the inner space.

30 Claims, 6 Drawing Sheets

(51) Int. Cl.
*H03H 9/05* (2006.01)
*H03H 9/10* (2006.01)
*H03H 9/08* (2006.01)
*H03L 1/02* (2006.01)
*H03B 1/02* (2006.01)
*H03H 9/21* (2006.01)
*H01L 41/053* (2006.01)
*H03L 1/04* (2006.01)
*H03H 9/02* (2006.01)
*H03H 9/19* (2006.01)

(52) U.S. Cl.
CPC .... *H03H 9/02023* (2013.01); *H03H 9/02102* (2013.01); *H03H 9/0509* (2013.01); *H03H 9/0519* (2013.01); *H03H 9/0552* (2013.01); *H03H 9/0595* (2013.01); *H03H 9/08* (2013.01); *H03H 9/1021* (2013.01); *H03H 9/1035* (2013.01); *H03H 9/19* (2013.01); *H03H 9/21* (2013.01); *H03L 1/022* (2013.01); *H03L 1/028* (2013.01); *H03L 1/04* (2013.01)

(58) Field of Classification Search
CPC .. H03H 9/0552; H03H 9/0519; H03H 9/0595; H03H 9/1035; H03H 9/08; H03H 9/21; H03H 9/02023; H03H 9/02102; H03H 9/0509; H03H 9/1021; H03H 9/19; H01L 41/053
USPC ..................... 331/158, 176, 68, 69
See application file for complete search history.

(56) References Cited

U.S. PATENT DOCUMENTS

| | | |
|---|---|---|
| 9,136,821 B2 | 9/2015 | Asamura |
| 2003/0061693 A1* | 4/2003 | Kikushima .......... H01L 41/053 29/25.35 |
| 2010/0123522 A1 | 5/2010 | Kasahara |
| 2014/0210567 A1* | 7/2014 | Koyama .............. H03H 9/1021 331/158 |
| 2014/0218121 A1 | 8/2014 | Asamura |
| 2015/0180443 A1 | 6/2015 | Hayashi et al. |
| 2018/0013386 A1* | 1/2018 | Arai .................... H03B 5/32 |

FOREIGN PATENT DOCUMENTS

| | | |
|---|---|---|
| JP | 2013150253 A | 8/2013 |
| JP | 2014236452 A | 12/2014 |
| JP | 2015089095 A | 5/2015 |
| JP | 2015122219 A | 7/2015 |
| JP | 2015139053 A | 7/2015 |

OTHER PUBLICATIONS

Written Opinion of the International Searching Authority issued in International Application No. PCT/JP2016/073535, dated Nov. 8, 2016.

* cited by examiner

PIEZOELECTRIC RESONATOR UNIT AND TEMPERATURE CONTROL METHOD THEREFOR, AND PIEZOELECTRIC OSCILLATOR

CROSS REFERENCE TO RELATED APPLICATIONS

The present application is a continuation of International application No. PCT/JP2016/073535, filed Aug. 10, 2016, which claims priority to Japanese Patent Application No. 2015-206667, filed Oct. 20, 2015, the entire contents of each of which are incorporated herein by reference.

BACKGROUND OF THE INVENTION

The present invention relates to a piezoelectric resonator unit and a temperature control method therefor, and to a piezoelectric oscillator.

Excellent frequency accuracy with respect to changes in the temperature of the surroundings are demanded in piezoelectric resonator units. In order to control the frequency of a piezoelectric resonator, the temperature of the piezoelectric resonator is detected and the piezoelectric resonator is heated in order to minimize changes that occurs in the frequency characteristics of the piezoelectric resonator as a result of temperature fluctuations. For example, Japanese Unexamined Patent Application Publication No. 2013-62707 discloses a piezoelectric device that is configured to detect the temperature of a piezoelectric resonator using a temperature-sensing component that is bonded to an outer surface of the piezoelectric resonator.

According to the configuration disclosed in the foregoing published application, the terminals of the temperature-sensing component are arranged on the outer surface of a package in which the piezoelectric resonator is housed. As a result, an error in the detected temperature may be large and it may take time until the temperature is detected. Consequently, it may not be possible to accurately control the frequency characteristic of the piezoelectric resonator.

BRIEF DESCRIPTION OF THE INVENTION

The present invention was made in light of the above-described circumstances, and it is one object of the invention to provide a piezoelectric resonator unit and a temperature control method therefor, and a piezoelectric oscillator in which the temperature of a piezoelectric resonator can be accurately detected and temperature control can be appropriately performed on the piezoelectric resonator.

In accordance with one aspect of the invention, a piezoelectric resonator unit, comprises a base having a mounting surface, a piezoelectric resonator mounted on the mounting surface, and a lid which is bonded to the mounting surface such that the piezoelectric resonator is hermetically sealed in an inner space. A heat conductor extends from a position outside of the inner space to a position in the inner space to provide a thermal connection to a temperature sensor and a heating element so that when the temperature sensor and the heating element are connected to the heat conductor from a position outside of the inner space, the heat conductor can apply heat to the inner space and the temperature sensor can sense the temperature of the inner space.

In one embodiment, a portion of the heat conductor is located on the mounting surface of the base member.

In some embodiments the piezoelectric resonator is mounted on the base member via an electrically conductive holding member and a portion of the heat conductor overlaps at least part of the piezoelectric resonator but does not touch the electrically conductive holding member.

In various embodiments, the piezoelectric resonator is a crystal resonator. In some embodiments, both the base member and the lid member are composed of a crystal material.

In some preferred embodiments the crystal resonator includes crystal blank having a main surface, an excitation electrode formed on the main surface, and a frame body that surrounds an outer periphery of the crystal blank and is connected to the crystal blank by a connection portion.

In some embodiments, the heat conductor includes a portion located on the frame body in the inner space. In other embodiments, the heat conductor includes a portion located on the connection portion in the inner space. In yet other embodiments, the heat conductor includes a portion located on the crystal blank in the inner space.

In another aspect, the invention is directed towards a piezoelectric oscillator including the foregoing piezoelectric resonator unit, an oscillation circuit that is electrically connected to the piezoelectric resonator, a temperature sensor, a heating element, and a control circuit that controls the temperature sensor and the heating element.

According to the above-described configurations, a portion of the heat conductor is arranged in the inner space in which the piezoelectric resonator is hermetically sealed. As a result, the temperature of the piezoelectric resonator can be accurately detected and the piezoelectric resonator can be effectively radiated with heat. In other words, a piezoelectric resonator unit can be provided in which the piezoelectric resonator is effectively radiated with heat on the basis of accurate changes in temperature, and therefore temperature control can be appropriately performed on the piezoelectric resonator.

In yet another aspect of the invention, the invention is directed towards a method for controlling the temperature of the piezoelectric resonator unit described above. The method includes (a) detecting a temperature of the piezoelectric resonator via the heat conductor portion of the heat conductor using the temperature sensor, (b) determining an amount of heat to be supplied to the heat conductor portion of the heat sensor by the heating element on the basis of the temperature detected in (a), and (c) radiating heat onto the piezoelectric resonator via a portion of the heat conductor located in the inner space using the heating element on the basis of the amount of heat to be supplied determined in (b).

According to the above-described configuration and method, because a portion of the heat conductor is arranged in the inner space in which the piezoelectric resonator is hermetically sealed, the temperature of the piezoelectric resonator can be accurately detected and the piezoelectric resonator can be effectively radiated with heat. In other words, a temperature control method can be provided in which the piezoelectric resonator is effectively radiated with heat on the basis of accurate changes in temperature, and therefore temperature control can be appropriately performed on the piezoelectric resonator.

The present invention can provide a piezoelectric resonator unit and a temperature control method therefor, and a piezoelectric oscillator in which the temperature of a piezoelectric resonator can be accurately detected and temperature control can be appropriately performed on the piezoelectric resonator.

DESCRIPTION OF THE EMBODIMENTS

Hereafter, embodiments of the present invention will be described. In the following description of the drawings, identical or similar constituent elements are denoted by identical or similar reference symbols. The drawings are representative, the dimensions and shapes of the individual parts are schematically illustrated, and the technical scope of the invention of the present application should not be interpreted as being limited to the embodiments.

First Embodiment

Figure 1:
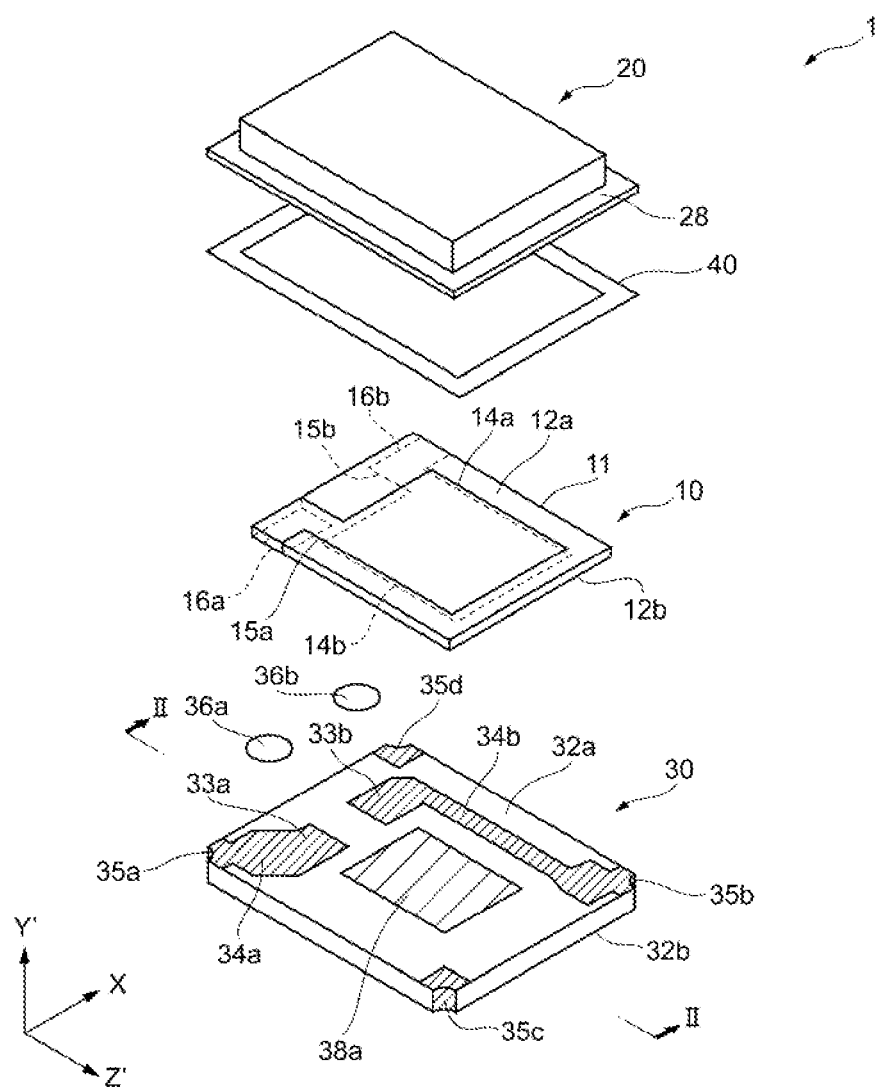
FIG. 1 is an exploded perspective view of a piezoelectric resonator unit according to a first embodiment of the present invention.
Figure 2:
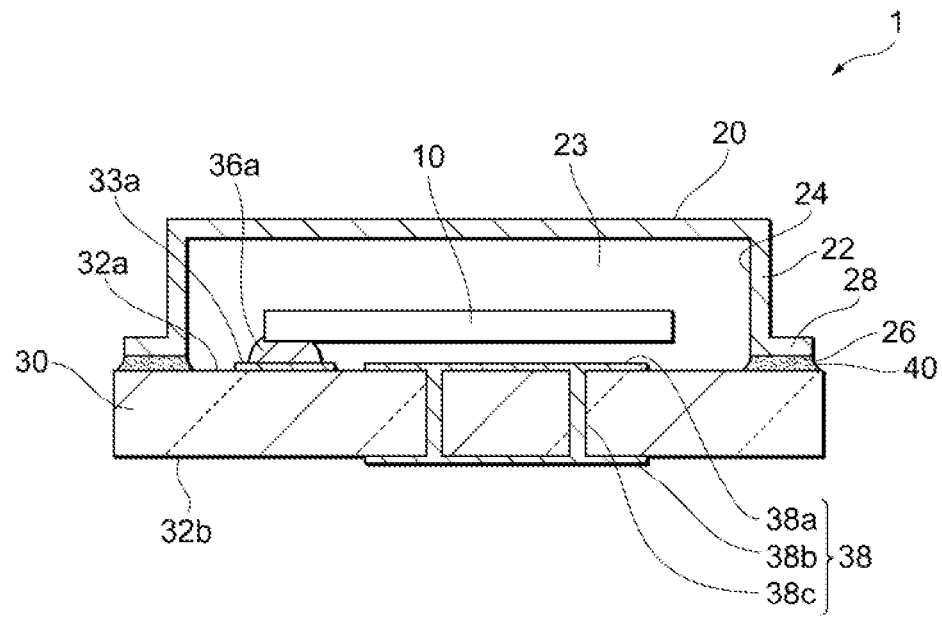
FIG. 2 is a sectional view taken along line II-II in FIG. 1.

A piezoelectric resonator unit according to a first embodiment of the present invention will be described while referring to FIGS. 1 to 3. FIG. 1 is an exploded perspective view of the piezoelectric resonator unit, and FIG. 2 is a sectional view taken along line II-II in FIG. 1. In FIG. 2, illustration of the various electrodes of the piezoelectric resonator is omitted.

As illustrated in FIG. 1, a piezoelectric resonator unit 1 according to this embodiment includes a piezoelectric resonator 10, a cap 20 (which is an example of a lid member) and a substrate 30 (which is an example of a base member). The cap 20 and the substrate 30 form a holder that holds the piezoelectric resonator 10. A case or a package that has a sealed space for housing the piezoelectric resonator 10 is formed by bonding the cap 20 and the substrate 30 to each other with a bonding member 40, described below, interposed therebetween.

The piezoelectric resonator 10 includes a piezoelectric substrate 11 and first and second excitation electrodes 14a and 14b that are formed on the piezoelectric substrate 11. The first excitation electrode 14a is formed on a first surface 12a, which is a main surface of the piezoelectric substrate 11, and the second excitation electrode 14b is formed on a second surface 12b, which is a main surface of the piezoelectric substrate 11 on the opposite side from the first surface 12a.

The piezoelectric substrate 11 is formed of a prescribed piezoelectric material. There are no particular restrictions on this material. In the example illustrated in FIG. 1, the piezoelectric substrate 11 is an AT-cut crystal blank. The AT-cut crystal blank is obtained by performing cutting such that main surfaces thereof are surfaces that are parallel to a plane defined by an X axis and a Z' axis (hereafter, referred to as an "XZ' plane". Similar definitions are used for planes specified using the other axes), where among an X axis, a Y axis, and a Z axis, which are crystallographic axes of an artificial crystal, a Y' axis and a Z' axis are axes that are respectively obtained by rotating the Y axis and the Z axis 35° 15'±1° 30' around the X axis in a direction from the Y axis toward the Z axis. In the example illustrated in FIG. 1, the piezoelectric substrate 11, which is an AT-cut crystal blank, has a longitudinal direction that is parallel to the Z' axis direction, a lateral direction that is parallel to the X axis direction, and a thickness direction that is parallel to the Y' axis direction, and has a rectangular shape when the XZ' plane is seen in a plan view. A crystal resonator, in which an AT-cut crystal blank is employed, has very high frequency stability over a wide temperature range, has excellent degradation over time characteristics, and can be manufactured at a low cost. An AT-cut crystal resonator typically employs a thickness shear mode as a main vibration.

The piezoelectric substrate according to this embodiment is not limited to the above-described configuration, and an AT-cut crystal blank having a longitudinal direction that is parallel to the X axis direction and a lateral direction that is parallel to the Z' axis direction may be adopted, for example. Alternatively, a crystal blank having a cut other than an AT cut (for example, a BT cut or the like) may be adopted, or another piezoelectric material other than a crystal such as a ceramic may be adopted.

The first excitation electrode 14a is formed on the first surface 12a of the piezoelectric substrate 11 (XZ' plane on positive Y' axis direction side) and the second excitation electrode 14b is formed on the second surface 12b (XZ' plane on negative Y' axis direction side) of the piezoelectric substrate 11, which is on the opposite side from the first surface 12a. The first and second excitation electrodes 14a and 14b are preferably arranged to substantially entirely overlap each other in the XZ' plane. The excitation electrodes 14a and 14b may each have a rectangular shape in the XZ' plane. In this case, the longitudinal directions of the excitation electrodes 14a and 14b are arranged in a direction so as to match the longitudinal direction of the piezoelectric substrate 11.

A connection electrode 16a, which is electrically connected to the first excitation electrode 14a via an extension electrode 15a, and a connection electrode 16b, which is electrically connected to the second excitation electrode 14b via an extension electrode 15b, are formed on the piezoelectric substrate 11. Specifically, the extension electrode 15a extends from the first excitation electrode 14a toward the short edge on the negative Z' axis direction side on the first surface 12a, passes over the side surface of the piezoelectric substrate 11 on the negative Z' axis direction side, and is connected to the connection electrode 16a, which is formed on the second surface 12b. On the other hand, the extension electrode 15b extends from the second excitation electrode 14b toward the short edge on the negative Z' axis direction side on the second surface 12b, and is connected to the connection electrode 16b, which is formed on the second surface 12b. The connection electrodes 16a and 16b are arranged along the short edge on the negative Z' axis direction side, and the connection electrodes 16a and 16b are electrically connected to the substrate 30 and are mechanically held on the substrate 30 via electrically conductive holding members 36a and 36b, which are described later. In this embodiment, the arrangements and pattern shapes of the connection electrodes 16a and 16b and the extension electrodes 15a and 15b are not restricted, and may be changed as appropriate while considering electrical connections between these electrodes and other members.

The above-mentioned electrodes, including the first and second excitation electrodes 14a and 14b, may be formed, for example, by forming a chromium (Cr) layer as a base and then forming a gold (Au) layer on the surface of the chromium layer. However, the electrodes are not limited to being formed with these materials.

As illustrated in FIG. 2, the cap 20 has a recess 24 that opens so as to face a first surface 32a of the substrate 30. The recess 24 is provided with a side wall portion 22, which is formed so as to stand upright from a bottom surface of the recess 24, along the entire periphery of the opening. In addition, the cap 20 has a facing surface 26 which faces the first surface 32a of the substrate 30 and is provided along the edge of the opening of the recess 24. The cap 20 may have a flange portion 28 that protrudes from the side wall portion 22 in a direction from the opening toward the outside. The facing surface 26 may be formed on flange portion 28. In this way, the bonding area between the cap 20 and the substrate 30 can be increased by bonding the flange portion 28 and the substrate 30 to each other, and therefore the strength of the bond between the cap 20 and the substrate 30 can be improved.

There are no particular restrictions on the shape of the cap 20. For example, the flange portion 28 may be omitted and a leading end of the side wall portion 22 formed so as to stand substantially vertical from the bottom surface of the recess 24 may instead be bonded to the substrate 30.

There are no particular restrictions on the material of the cap 20. The cap 20 may, for example, be formed of an electrically conductive material such as a metal. With this configuration, a shield function can be added by electrically connecting the cap 20 to the ground potential. Alternatively, the cap 20 may be composed of an insulating material or may have a composite structure composed of an electrically conductive material and an insulating material.

The piezoelectric resonator 10 is mounted on the first surface 32a (mounting surface) of the substrate 30. In the example illustrated in FIG. 1, the substrate 30 has a longitudinal direction that is parallel to the Z' axis direction, a lateral direction that is parallel to the X axis direction, and a thickness direction that is parallel to the Y' axis direction, and has a rectangular shape in the XZ' plane. The substrate 30 may be formed of an insulating ceramic, for example. Alternatively, the substrate 30 may be formed of a glass material (for example, silicate glass or a material having a material other than silicate as a main component and exhibiting a glass transition phenomenon with an increase in temperature), a crystal material (AT-cut crystal), a glass epoxy resin, or the like. In the illustrated embodiment the substrate 30 has a single layer. However, it may instead be formed of a plurality of layers. When it is formed of a plurality of layers, an insulating layer may be included that is formed as the outermost layer at the first surface 32a. By way of further example, the substrate 30 may be shaped like a flat plate or may have a recessed shape that opens so as to face the cap 20. As illustrated in FIG. 2, the piezoelectric resonator 10 is preferably hermetically sealed inside an inner space (cavity) 26, which is surrounded by the recess 24 of the cap 20 and the substrate 30, by bonding the cap 20 and the substrate 30 to each other via the bonding member 40.

The bonding member 40 is preferably provided along the entire periphery of the cap 20 and the substrate 30, and is interposed between the facing surface 26 of the side wall portion 22 of the cap 20 and the first surface 32a of the substrate 30. The bonding member 40 may be composed of an insulating material. The insulating material may, for example, be a glass material (for example, a low-melting-point glass) or a resin material (for example, an epoxy-based resin). As a result of using such an insulating material, compared with metal bonding, the cost is low, and an increase in temperature can be suppressed and the manufacturing process can be simplified. In the case where a shield function is added to the cap 20, it is preferable that the cap 20 and the substrate 30 be bonded to each other via the bonding member 40 while securing an electrical connection to the cap 20.

In the example illustrated in FIG. 2, one end of the piezoelectric resonator 10 (an end portion on electrically conductive holding members 36a and 36b side) is a fixed end and the other end of the piezoelectric resonator 10 is a free end. As a modification, the piezoelectric resonator 10 may be fixed to the substrate 30 at both ends thereof in the longitudinal direction.

As illustrated in FIG. 1, the substrate 30 includes connection electrodes 33a and 33b that are formed on the first surface 32a, and extension electrodes 34a and 34b that extend from the connection electrodes 33a and 33b toward the outer edge of the first surface 32a. The connection electrodes 33a and 33b are spaced inwardly from the outer edge of the substrate 30 such that the piezoelectric resonator 10 is arranged in substantially the center of the first surface 32a of the substrate 30.

The connection electrode 16a of the piezoelectric resonator 10 is connected to the connection electrode 33a via the electrically conductive holding member 36a, and the connection electrode 16b of the piezoelectric resonator 10 is connected to the connection electrode 33b via the electrically conductive holding member 36b. The electrically conductive holding members 36a and 36b are preferably formed by, for example, thermally curing an electrically conductive adhesive.

The extension electrode 34a extends from the connection electrode 33a toward any one corner of the substrate 30, and the extension electrode 34b extends from the connection electrode 33b toward another one corner of the substrate 30. In addition, a plurality of outer electrodes 35a, 35b, 35c, and 35d are formed at respective corners of the substrate 30, and in the example illustrated in FIG. 1, the extension electrode 34a is connected to the outer electrode 35a formed at the corner that is on the negative X axis direction side and negative Z' axis direction side, and the extension electrode 34b is connected to the outer electrode 35b formed at the corner on the positive X axis direction side and the positive Z' axis direction side. Furthermore, as illustrated in FIG. 1, the outer electrodes 35c and 35d may be formed in the remaining corners, and these outer electrodes may be dummy electrodes that are not electrically connected to the piezoelectric resonator 10. As a result of such dummy electrodes being formed, the process of applying an electrically conductive material for forming the outer electrodes is simplified and outer electrodes can be formed in all the corners, and therefore the processing step of electrically connecting the piezoelectric resonator unit to other members is also simplified. The dummy electrodes may be electrically connected to terminals that are provided on a mounting substrate (not illustrated) on which the piezoelectric resonator unit is to be mounted and that are not connected to any other electronic elements mounted on the mounting substrate. In addition, the outer electrodes 35c and 35d, which are dummy electrodes, may be ground electrodes to which a ground potential is supplied. In the case where the cap 20 is composed of an electrically conductive material, a shield function may be added to the cap 20 by connecting the cap 20 to the outer electrodes 35c and 35d, which serve as ground electrodes.

In the example illustrated in FIG. 1, the corners of the substrate 30 each have a cut-away side surface formed by cutting away part of the corner to form a cylindrical curved surface shape (also referred to as castellation shape), and the outer electrodes 35a to 35d are formed in a continuous manner across these cut-away side surfaces and a second surface 32b of the substrate 30. The shape of the corners of the substrate 30 is not limited to this example, and the cut-away shape may be a flat surface shape or the corners may not be cut away and the four corners may instead have a right-angle rectangular shapes in plan view.

The configurations of the connection electrodes, the extension electrodes, and outer electrodes of the substrate 30 are not limited to the above-described examples, and can be modified in various ways. For example, the connection electrodes 33a and 33b may be formed on different sides from each other on the first surface 32a of the substrate 30 such as one connection electrode being formed on the positive Z' axis direction side and the other connection electrode being formed on the negative Z' axis direction side. In this configuration, the piezoelectric resonator 10 is supported on the substrate 30 at one end and the other end thereof in the longitudinal direction. In addition, the number of outer electrodes is not limited to four, and there may instead be two outer electrodes arranged at diagonally opposite corners, for example. Furthermore, the outer electrodes are not limited to being arranged at the corners, and may instead be formed on any parts of the side surfaces of the substrate 30 excluding the corners. In this case, as has already been described, cut-away side surfaces may be formed by cutting away parts of the side surfaces to form cylindrical curved surface shapes, and the outer electrodes may be formed on these parts of the side surfaces excluding the corners. In addition, the other dummy electrodes 35c and 35d, which are dummy electrodes, do not have to be formed. Furthermore, through holes that penetrate from the first surface 32a to the second surface 32b may be formed in the substrate 30, and electrical connections from connection electrodes formed on the first surface 32a to the second surface 32b may be realized using the through holes.

In the piezoelectric resonator unit 1 illustrated in FIG. 1, an alternating-current voltage is preferably applied between the pair of first and second excitation electrodes 14a and 14b of the piezoelectric resonator 10 via the outer electrodes 35a and 35b of the substrate 30, and, as a result, the piezoelectric substrate 11 vibrates in a prescribed vibration mode such as a thickness shear mode, and resonance characteristics are obtained in accordance with the vibration.

In this embodiment, as illustrated in FIGS. 1 and 2, the piezoelectric resonator unit 1 has a heat conductor 38 including a heat conductor portion 38a formed on the upper surface 32a of the substrate 30, an outer connection portion 38b formed on the lower surface 32b of substrate 30 and a connection portion 38c extending through the substrate 30 which is formed of a material having higher thermal conductivity than the substrate 30. Specifically, the heat conductor path 38 is preferably formed of a metal conductor composed of a metal material. The heat conductor path 38 is formed so as to be separated from the various electrodes formed on the substrate 30, including the connection electrodes 33a and 33b and the extension electrodes 34a and 34b. By way of example, the heat conductor 38 may be formed of a metal conductor composed of the same material as the various electrodes on the substrate 30 or a material that has better thermal conductivity than those metal conductors may be used.

The heat conductor 38 is formed so as to be able to be electrically connected to a temperature sensor that detects the temperature of the piezoelectric resonator 10, and a heating element that radiates heat onto the piezoelectric resonator 10. In other words, the heat conductor 38 is employed in both a temperature-detecting function using the temperature sensor and a heat-radiating function using the heating element. The configurations of the temperature sensor and the heating element are described below.

As illustrated in FIG. 1, the heat conductor 38 has a heat conductor portion 38a that is arranged in an inner space 23 in which the piezoelectric resonator 10 is housed. The heat conductor portion 38a may be formed on the first surface 32a of the substrate 30. Specifically, the heat conductor portion 38a may be formed in a region of the first surface 32a of the substrate 30 that is spaced away from the connection electrodes 33a and 33b and the extension electrodes 34a and 34b. Since the piezoelectric resonator 10 is held by the electrically conductive holding members 36a and 36b, the heat conductor portion 38a can be formed on the first surface 32a of the substrate 30 so as to be disposed directly below the piezoelectric resonator 10 and with a prescribed gap between the heat conductor portion 38a and the piezoelectric resonator 10. The heat conductor portion 38a may be, by way of example, formed on part of the first surface 32a of the substrate 30 that overlaps part of the piezoelectric resonator 10 (for example, the excitation electrode 14b). As a result, the heat conductor portion 38a can be arranged close to the piezoelectric resonator 10, and the performances of the heat-radiating function and the temperature-detecting function of the heat conductor portion 38a can be improved. As illustrated in FIG. 1, the heat conductor portion 38a may overlap a large part of the facing excitation electrode (second excitation electrode 14b in example illustrated in FIG. 1), or may overlap the entirety of the facing excitation electrode.

Figure 3:
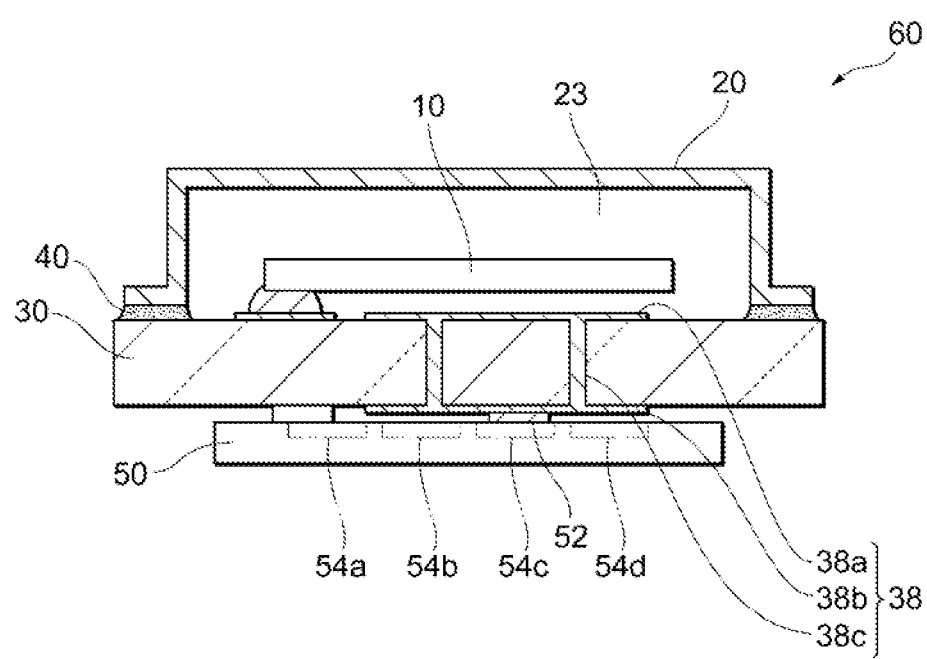
FIG. 3 is a sectional view of a piezoelectric oscillator according to the first embodiment of the present invention.

As best shown in FIGS. 2 and 3, the conductor 38 further includes an outer connection portion 38b that is arranged on the second surface 32b of the substrate 30 and a through connection portion 38c that connects the heat conductor portion 38a and the outer connection portion 38b to each other. The outer connection portion 38b of the heat conductor 38 is electrically and thermally connected to the temperature sensor and the heating element (described below) that are arranged outside the inner space 23 in which the piezoelectric resonator 10 is housed. As a result the temperature of the piezoelectric resonator 10 can be detected and the piezoelectric resonator 10 can be radiated with heat.

Next, a piezoelectric oscillator according to this embodiment will be described. FIG. 3 is a diagram illustrating a piezoelectric oscillator 60. The piezoelectric oscillator 60 includes the above-described piezoelectric resonator unit 1 and an integrated circuit element 50.

The integrated circuit element 50 preferably includes circuits that are necessary for the piezoelectric resonator unit to perform desired operations. The circuits are preferably formed on an integrated circuit surface of the integrated circuit element 50. For example, as illustrated in FIG. 3, the integrated circuit element 50 includes an oscillation circuit 54a for generating a reference signal such as a clock signal, a temperature sensor 54b for detecting the temperature of the piezoelectric resonator 10, a heating element 54c for radiating heat onto the piezoelectric resonator 10 via the heat conductor 38, and a control circuit 54d (e.g., a programmed processor or other electronic unit that can perform the desired functions) for controlling the temperature sensor 54b and the heating element 54c. The control circuit 54d can control switching between a temperature detection operation performed by the temperature sensor 54b and a heat radiating operation performed by the heating element 54c in an electronic circuit. In addition, the control circuit 54d may be configured to determine an amount of heat to be supplied to the heat conductor portion 38a by the heating element 54c on the basis of the temperature detected by the temperature sensor 54b and cause the heating element 54c to radiate heat onto the piezoelectric resonator 10 via the heat conductor portion 38a.

As illustrated in FIG. 3, the integrated circuit element 50 is mounted on the second (bottom) surface 32b of the substrate 30. Specifically, a plurality of electrodes 52 that are formed on the integrated circuit surface side of the integrated circuit element 50 are mounted in a direction so as to face the second surface 32b of the substrate 30. At least any one of the plurality of electrodes 52 is preferably connected to the outer connection portion 38b of the heat conductor path 38.

The way in which the integrated circuit element 50 is mounted is not limited to the above-described example. That is, the integrated circuit element 50 is not limited to being directly mounted on an outer surface of the piezoelectric resonator unit 1 and may, for example, instead be mounted along with the piezoelectric resonator unit 1 on one surface of a circuit board (not illustrated). In this case, an electrode 52 (specifically, an electrode electrically connected to the temperature sensor 54b, the heating element 54c or the control circuit 54d) of the integrated circuit element 50 and the heat conductor 38) may, for example, be connected to each other via a wiring line on the circuit board.

Furthermore, although a configuration is described in the example illustrated in FIG. 3 in which the oscillation circuit 54a, the temperature sensor 54b, the heating element 54c, and the control circuit 54d are built into a single integrated circuit element, this is not required. As a modification, an integrated circuit element that has one or more of these circuits built thereinto may be mounted on the substrate 30 or a circuit board.

According to the piezoelectric resonator unit of this embodiment, the heat conductor portion 38a of the heat conductor 38 is arranged in the inner space 23 in which the piezoelectric resonator 10 is hermetically sealed and therefore the temperature of the piezoelectric resonator 10 can be accurately detected and heat can be effectively radiated onto the piezoelectric resonator 10. In other words, the piezoelectric resonator 10 is effectively radiated with heat on the basis of accurate changes in temperature and therefore temperature control can be appropriately performed on the piezoelectric resonator 10. In addition, the heat conductor path 38 is employed in both a temperature-detecting function using the temperature sensor 54b and a heat-radiating function using the heating element 54c, and therefore space can be saved in a pattern formation region, and a reduction in the size of the piezoelectric resonator unit 1 can be realized.

Furthermore, the piezoelectric oscillator according to this embodiment includes the above-described piezoelectric resonator unit 1, and therefore, as has already been described, temperature control can be appropriately performed on the piezoelectric resonator 10.

Figure 4:
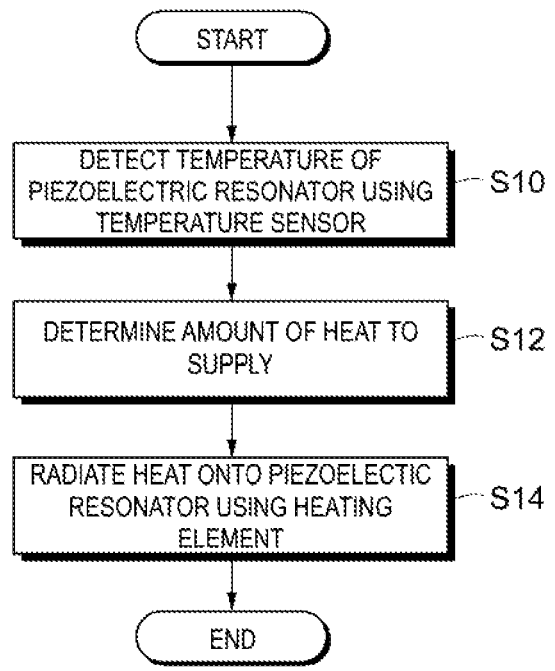
FIG. 4 is a flowchart illustrating a temperature control method for the piezoelectric resonator unit according to the first embodiment of the present invention.

Next, a temperature control method for the piezoelectric resonator unit according to this embodiment will be described with reference to FIG. 4. FIG. 4 is a flowchart illustrating a temperature control method for the piezoelectric resonator unit according to this embodiment. This temperature control method can be executed using the piezoelectric oscillator 60 illustrated in FIG. 3.

First, the temperature of the piezoelectric resonator 10 is detected by the temperature sensor 54b (S10). Specifically, the control circuit 54d performs control to switch on a temperature detection operation performed by the temperature sensor 54b, and the temperature of the piezoelectric resonator 10 in the inner space 23 is detected via the heat conductor portion 38a. As described above, the heat conductor portion 38a is arranged in the inner space 23 and is close to the piezoelectric resonator 10, and therefore an accurate temperature of the piezoelectric resonator 10 can be detected in a short period of time.

Next, on the basis of the temperature detected in S10, the amount of heat to be supplied to the heat conductor portion 38a of the heat conductor 38 by the heating element 54c is determined (S12). In this case, the amount of heat to be supplied may be determined by comparing the detected temperature and a desired threshold (target temperature). For example, in the case where the detected temperature is much lower than a prescribed threshold, a determination is made to supply a large amount of heat, in the case where the detected temperature is slightly lower than the prescribed threshold, a determination is made to supply a small amount of heat, and in the case where the piezoelectric resonator 10 is equal to or higher than the prescribed threshold, a determination is made to not supply any heat. The amount of heat to be supplied can be determined by controlling power consumption of the heating element 54c. Determination of the amount of heat to be supplied can be executed by the control circuit 54d.

Next, heat is radiated onto the piezoelectric resonator 10 via the heat conductor portion 38a of the heat conductor 38 by the heating element 54c on the basis of the amount of heat to be supplied determined in S12 (S14). Specifically, the control circuit 54d performs control to switch on an operation of radiating heat using the heating element 54c, and heat is radiated onto the piezoelectric resonator 10 via the heat conductor portion 38a on the basis of the amount of heat to be supplied determined in accordance with the detected temperature. As described above, the heat conductor portion 38a is arranged in the inner space 23 and is close to the piezoelectric resonator 10, and therefore heat can be effectively radiated onto the piezoelectric resonator 10.

The processing of S10 to S14 described above is repeatedly performed at a prescribed timing by the control circuit 54d. The control circuit 54d performs control such that when one out of the temperature sensor 54b and the heating element 54c is turned on, the other out of the temperature sensor 54b and the heating element 54c is turned off such that only the temperature sensor 54b or the heating element 54c operates any given instant.

With the temperature control method of the piezoelectric resonator unit according to this embodiment, the piezoelectric resonator 10 is subjected to temperature control as described above.

In the configuration as described above with respect to the above-described embodiment, the piezoelectric resonator 10 is housed inside an inner space as a result of the cap 20 having a recessed shape and the substrate 30 having a flat plate shape. However, the configurations of the lid member and the base member are not limited to this configuration. For example, a flat-plate-shaped lid member and a recessed base member may be bonded to each other, or a recessed lid member and a recessed base member may be bonded to each other in such a direction that the openings thereof face each other. Furthermore, an inner space can also be formed by bonding a flat-plate-shaped lid member and a flat-plate-shaped base member to each other via a bonding member and using the bonding member as a spacer.

In addition, for example, both the lid member and the base member may be formed of the same material as the piezoelectric material of the piezoelectric resonator (for example, a crystal) and the heat conductor portion of the heat conductor may be formed on either a lid member or a base member composed of a crystal. With this configuration, the heat conductor portion of heat conductor path can be formed of the same material as the target of temperature detection, and therefore temperature detection accuracy can be improved.

Second Embodiment

Figure 5:
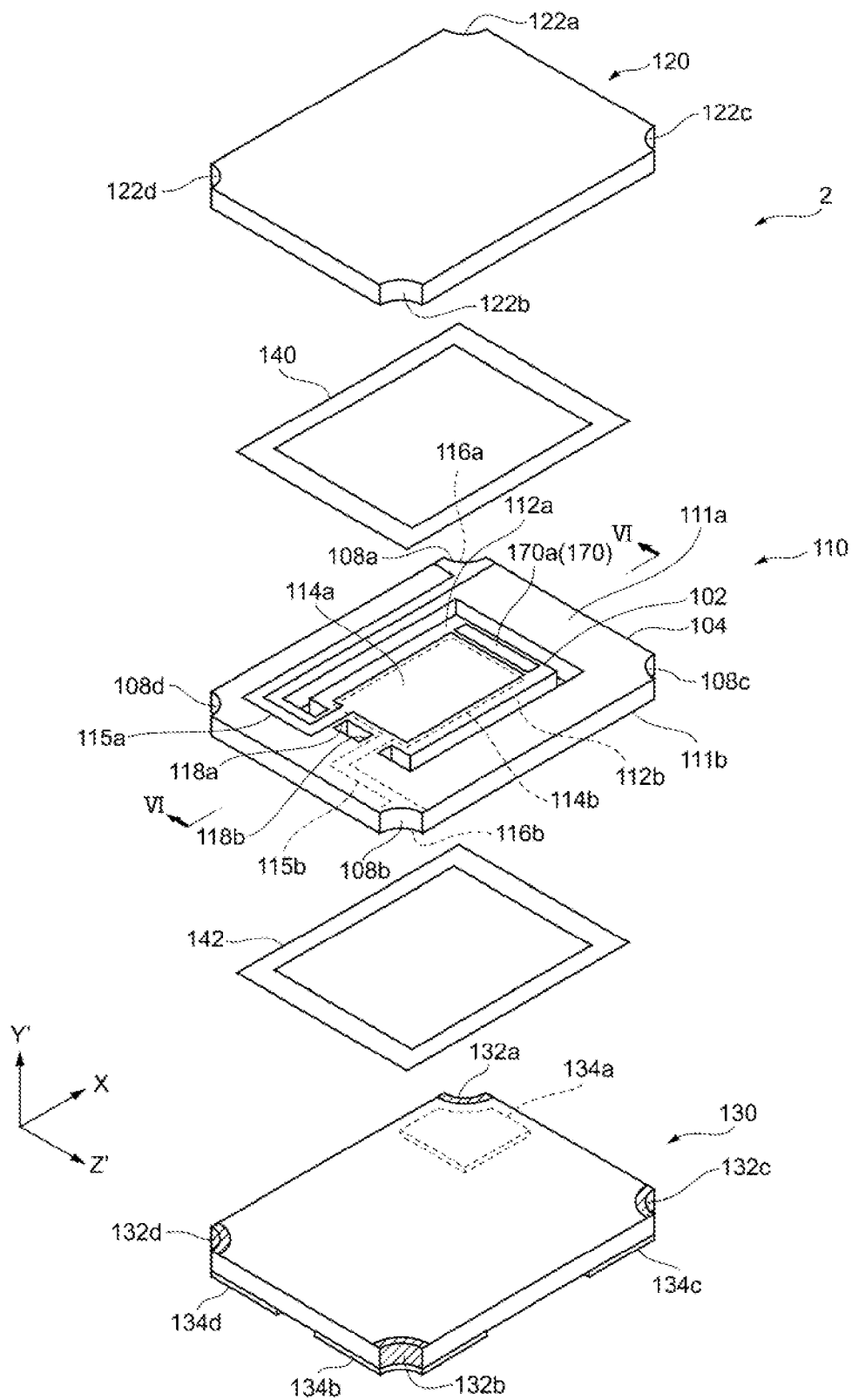
FIG. 5 is an exploded perspective view of a piezoelectric resonator unit according to a second embodiment of the present invention.
Figure 6:
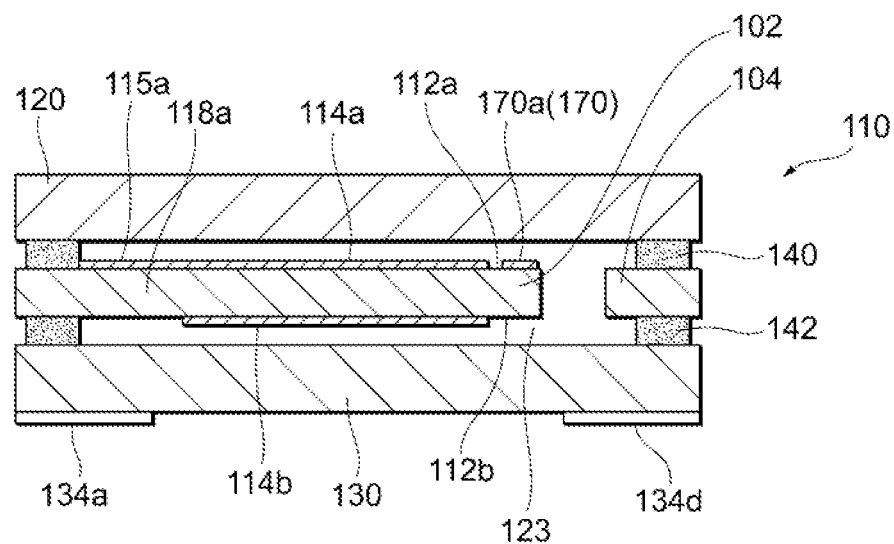
FIG. 6 is a sectional view taken along line VI-VI in FIG. 5.

A piezoelectric resonator unit according to a second embodiment of the present invention will be described while referring to FIGS. 5 and 6. In this case, FIG. 5 is an exploded perspective view of the piezoelectric resonator unit and FIG. 6 is a sectional view taken along line VI-VI in FIG. 5. In this embodiment, the form of the packaging of the piezoelectric resonator is different from that in the first embodiment. In the following description, points that differ from the content of the first embodiment are described.

As illustrated in FIG. 5, a crystal piezoelectric resonator unit 2 according to this embodiment includes a crystal resonator 110, a first crystal substrate 120 and a second crystal substrate 130.

The crystal resonator 110 is formed, for example, of an AT-cut crystal substrate. The advantages of an AT cut are as described above with respect to the first embodiment. Alternatively, while this is a preferred configuration, the crystal resonator 110 may be formed of a crystal substrate having a cut other than an AT cut.

The first crystal substrate 120 is an example of a lid member and the second crystal substrate 130 is an example of a base member. The first crystal substrate 120 and the second crystal substrate 130 form a case or package for housing part (a crystal blank) of the crystal resonator 110. The crystal resonator 110, the first crystal substrate 120, and the second crystal substrate 130 preferably have substantially the same dimensions and outer shape (for example, a substantially rectangular outer shape). In addition, the first crystal substrate 120 and the second crystal substrate 130 may be crystal substrates having the same cut as the crystal resonator 110 (for example, AT-cut crystal substrates).

The crystal resonator 110 includes a crystal blank 102 and a frame body 104 that surrounds the outer periphery of the crystal blank 102. Both the crystal blank 102 and the frame body 104 may be formed of an AT-cut crystal substrate. The crystal blank 102 and the frame body 104 each have a longitudinal direction that is parallel to the X axis direction, a lateral direction that is parallel to the Z' axis direction, and a thickness direction that is parallel to the Y' axis direction. The crystal blank 102 is connected to the frame body 104 by connection portions 118a and 118b. The connection portions 118a and 118b are arranged at one end of the crystal blank 102 in the longitudinal direction (negative X axis direction side). In other words, the crystal blank 102 is provided so as to be separated from the frame body 104 except for at the connection portions 118a and 118b. The foregoing number and arrangement of the connection portions are merely examples and are not limiting.

The crystal resonator 110 has cut-away side surfaces 108a, 108b, 108c, and 108d that are formed by cutting away part of each corner to form a cylindrical curved surface shape (or castellation shape). In addition, similarly, cut-away sides surfaces 122a, 122b, 122c, and 122d are also formed in the first crystal substrate 120, and cut-away side surfaces 132a, 132b, 132c, and 132d are also formed in the second crystal substrate 130. The cut-away sides surfaces of the crystal resonator 110, the first crystal substrate 120, and the second crystal substrate 130 at corresponding corners (for example, the cut-away side surfaces 108a, 122a, and 132a) are respectively arranged so as to be aligned with each other in the Y' axis direction. These cut-away side surfaces are formed when a manufacturing method in which steps up to the packaging step are performed in a wafer state, which is referred to as wafer-level CSP, is employed. The shapes of the cut-away surfaces are not limited to being cylindrical curved surface shapes.

The crystal resonator 110 includes first and second excitation electrodes 114a and 114b that are formed on respective opposed main surfaces of the crystal blank 102. The part of the crystal blank 102 across which the first and second excitation electrodes 114a and 114b face each other serves as a vibration part. Although the thickness of the crystal blank 102 is not particularly limited, as illustrated in FIG. 6, the thickness of the vibration part of the crystal blank 102 may be substantially the same as the thickness of the frame body 104. Alternatively, the thickness of the vibration part of the crystal blank 102 may be smaller than the thickness of the frame body 104. In addition, the thicknesses of the connection portions 118a and 118b may be the same as the thickness of the vibration part of the crystal blank 102, or may be thinner. The thicknesses of the crystal blank 102, the connection portions 118a and 118b, and the frame body 104 can be set as appropriate.

The first excitation electrode 114a is formed on a first surface 112a of the crystal blank 102 (surface on positive Y' axis direction side), and the second excitation electrode 114b is formed on a second surface 112b of the crystal blank 102 (surface on negative Y' axis direction side). The first and second excitation electrodes 114a and 114b are arranged so as to substantially entirely overlap each other as a pair of electrodes. In addition, an extension electrode 115a, which is electrically connected to the first excitation electrode 114a, is formed on a first surface 111a of the frame body 104. The extension electrode 115a extends from the first excitation electrode 114a via one connection portion 118a, then extends across the first surface 111a of the frame body 104 toward the cut-away side surface 108a at the corner, and is electrically connected to a connection electrode 116a that is formed on a second surface 111b of the frame body 104. In addition, an extension electrode 115b, which is electrically connected to the second excitation electrode 114b, is formed on the second surface 111b of the frame body 104. The extension electrode 115b extends from the second excitation electrode 114b via the other connection portion 118b, then extends across the second surface 111b of the frame body 104 to the cut-away side surface 108b in the corner, and is electrically connected to a connection electrode 116b formed on the second surface 111b of the frame body 104. Thus, in the example illustrated in FIG. 5, the connection electrodes 116b and 116b, which are electrically connected to the first and second excitation electrodes 114a and 114b, respectively, are arranged at opposite corners of the frame body 104.

The arrangement of the connection electrodes 116a and 116b that are electrically connected to the first and second excitation electrodes 114a and 114b is not particularly limited, and the connection electrodes 116a and 116b may alternatively be arranged at the two corners of the frame body 104 on the negative X axis direction side (i.e., the cut-away side surfaces 108d and 108b), for example.

The above-mentioned electrodes, including the first and second excitation electrodes 114a and 114b, may be formed, for example, by forming a chromium (Cr) layer as a base and then forming a gold (Au) layer on the surface of the chromium layer, but the electrodes are not limited to being formed with these materials.

Outer electrodes 134a, 134b, 134c, and 134d are preferably formed at the corners of the second crystal substrate 130. As an example, the outer electrode 134a is formed in an integrated manner at a corner of the second crystal substrate 130 so as to extend from the mounting surface side of the crystal resonator 110 (positive Y' axis direction side) to the mounting surface of the second crystal substrate 130 (surface on negative Y' axis direction side) via the cut-away side surface 132a. In addition, the outer electrodes 134b to 134d are similarly formed at the corresponding corners, as illustrated in FIG. 5. The outer electrodes 134a and 134b of the second crystal substrate 130 (that is, outer electrodes arranged at opposite corners of second crystal substrate 130) are electrically connected to the first and second excitation electrodes 114a and 114b. Specifically, the crystal resonator 110 is mounted on the second crystal substrate 130 via a bonding member 142, which is described later, and the connection electrode 116a and the outer electrode 134a and the connection electrode 116b and the outer electrode 134b are respectively electrically connected to each other by electrically conductive members, which are not illustrated. For example, the electrically conductive members may be formed by applying and then thermally curing an electrically conductive adhesive, or may be formed by depositing an electrically conductive material using a sputtering method or the like. The electrically conductive members may be formed in an integrated manner on the corresponding cut-away side surfaces of the first crystal substrate 120, the crystal resonator 110, and the second crystal substrate 130. In addition, there are no particular restrictions on which corners the outer electrodes 134a and 134b, which are electrically connected to the first and second excitation electrodes 114a and 114b, are arranged at.

The first crystal substrate 120 is arranged on the first surface 111a side of the frame body 104, the second crystal substrate 130 is arranged on the second surface 111b side of the frame body 104, and the first crystal substrate 120, the crystal resonator 110, and the second crystal substrate 130 thus form a three-layer structure with the layers stacked in this order.

As illustrated in FIGS. 5 and 6, the first crystal substrate 120 is bonded to the entire periphery of the first surface 111a of the frame body 104 using a first bonding member 140, and the second crystal substrate 130 is bonded to the entire periphery of the second surface 111b of the frame body 104 using a second bonding member 142. The first and second bonding members 140 and 142 are preferably provided along the entire peripheries of the surfaces of the frame body 104 and as a result the crystal blank 102 is hermetically sealed in an inner space (cavity) 123 (FIG. 6). There are no restrictions on the materials of the first and second bonding members 140 and 142 so long as the first and second bonding members 140 and 142 can bond the bonding surfaces of the respective members to each other and preferably hermetically seal the inner space. For example, a glass adhesive material such as a low-melting-point glass (for example, a lead boric acid or tin phosphoric acid based glass) may be used or a resin adhesive may be used.

In this embodiment, as illustrated in FIGS. 5 and 6, a heat conductor portion 170a of a heat conductor path 170 is arranged on the crystal resonator 110 in the inner space 123. Specifically, the heat conductor portion 170a is formed on the crystal blank 102 (preferably on part excluding the connection portions 118a and 118b). In this case, the heat conductor portion 170a is formed so as to avoid the regions in which the first and second excitation electrodes 114a and 114b are formed. Although the heat conductor portion 170a is formed on the first surface 112a of the crystal blank 102 in the illustrated example, the heat conductor portion 170a is not limited to being arranged in this manner. For example, the heat conductor portion 170a may be formed on the second surface 112b of the crystal blank 102, may be formed on a side surface of the crystal blank 102 between the first surface 112a and the second surface 112b, or may be formed at any two or more of these locations. In addition, there are also no particular restrictions on the position of the heat conductor portion 170a in plan view, and the heat conductor portion 170a may be arranged on the opposite side (short edge on positive X axis direction side) from the connection portions 118a and 118b as in FIG. 5, or alternatively, so long as there is space on the first surface 112a of the crystal blank 102, the heat conductor portion 170a may be formed so as to surround the first excitation electrode 114a along three sides excluding the side where the connection portions 118a and 118b are disposed.

The content already described above can be employed for the rest of the configuration of the heat conductor path 170. In addition, illustration of electrical connection portions extending from the heat conductor portion 170a to connections to the temperature sensor and the heating element is omitted from FIGS. 5 and 6. However, such electrical connection portions are preferably appropriately routed so as to avoid the first and second excitation electrodes 114a and 114b.

In the piezoelectric resonator unit of this embodiment, the heat conductor portion 170a is formed on the crystal blank 102, which is the target of temperature detection, and therefore a more accurate temperature can be detected and heat can be radiated more effectively.

Figure 7:
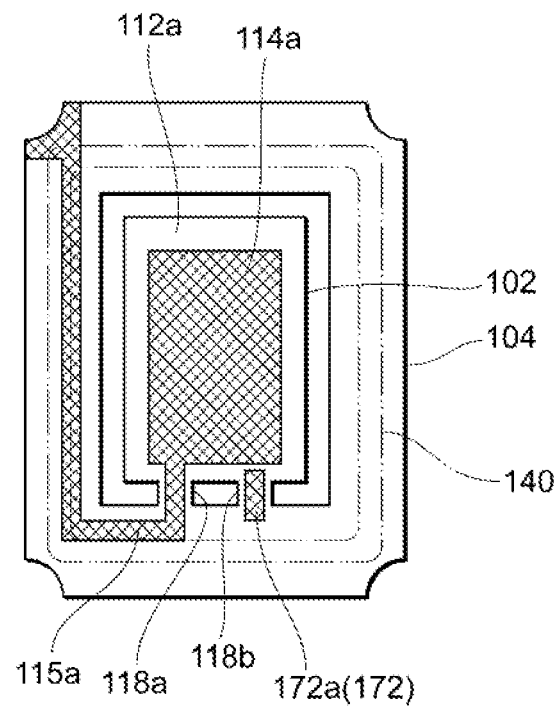
FIG. 7 is a diagram for describing a piezoelectric resonator unit according to a first modification of the second embodiment of the present invention.
Figure 8:
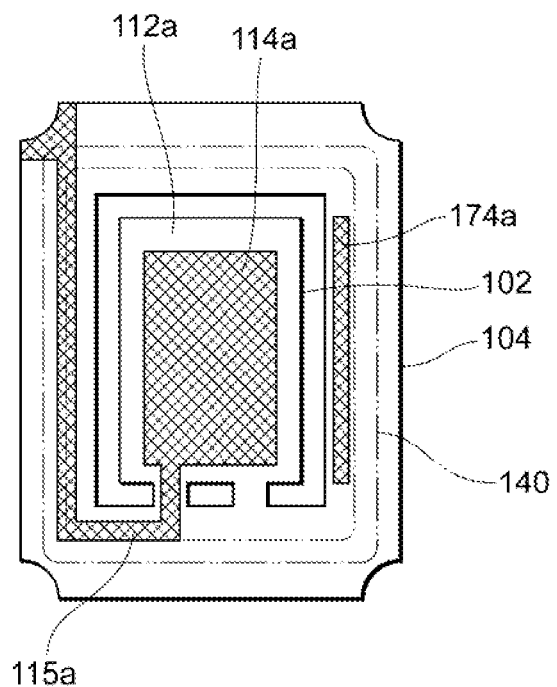
FIG. 8 is a diagram for describing a piezoelectric resonator unit according to a second modification of the second embodiment of the present invention.

Next, piezoelectric resonator units according to modifications of this embodiment will be described while referring to FIGS. 7 and 8. FIGS. 7 and 8 are diagrams for respectively describing piezoelectric resonator units according to first and second modifications of this embodiment, and specifically are plan views of the crystal resonators. In addition, constituent parts that are identical to those described in the second embodiment are denoted by the same symbols in FIGS. 7 and 8. In these modifications, the position at which the heat conductor portion of the heat conductor path is different from that described above, only the differences will be described hereafter.

As illustrated in FIG. 7, a heat conductor portion 172a of a heat conductor 172 may be formed on at least the connection portion 118b. In the example illustrated in FIG. 7, the extension electrode 115a, which is electrically connected to the first excitation electrode 114a, is formed on the first surface 112a side of the connection portion 118a among the two connection portions 118a and 118b. In contrast, the heat conductor portion 172a is formed on the first surface 112a side of the connection portion 118b. In addition, in the example illustrated in FIG. 7, the heat conductor portion 172a is formed on the first surface 112a side of the crystal blank 102, but the heat conductor portion 172a is not limited to being arranged in this manner. For example, the heat conductor portion 172a may be formed on the second surface 112b side of the crystal blank 102, may be formed on a side surface of a connection portion (inner side surface facing the other connection portion or outer side surface facing the frame body 104), or may be formed in an integrated or individual manner at any two or more of these locations.

Alternatively, as illustrated in FIG. 8, a heat conductor portion 174a of a heat conductor 174 may be formed on the frame body 104. In this case, the heat conductor portion 174a may be formed in a region of the frame body 104 that is closer toward the inside conductor than to the bonding member 140. As a result, the heat conductor portion 174a can be arranged in the inner space. Although the heat conductor portion 174a is formed on the first surface 112a of the crystal blank 102 in the illustrated example, the heat conductor portion 174a is not limited to being arranged in this manner, and alternatively the heat conductor portion 174a may be formed on the second surface 112b of the crystal blank 102, may be formed on an inner peripheral side surface of the frame body 104 (i.e., inner surface on crystal blank 102 side) between the first surface 112 and the second surface 112b, or may be formed at any two or more of these locations. In addition, there are also no particular restrictions on the position of the heat conductor portion 174a in plan view, and the heat conductor portion 174a may be arranged along one long side as in FIG. 8, or alternatively, so long as there is space on the first surface 112a of the frame body 104, the heat conductor portion 174a may be formed so as to surround the crystal blank 102 along three sides excluding the side where the connection portions 118a and 118b are disposed.

According to these modifications of this embodiment, the heat conductor portions 172a and 174a can be formed so as to be close to the crystal blank 102, which is the target of temperature detection, and therefore a more accurate temperature can be detected and heat can be more effectively radiated.

As described above, as a result of adopting any of the above-described configurations, a piezoelectric resonator unit, a temperature control method therefor, and a piezoelectric oscillator according to an embodiment or modification of the present invention can exhibit the following operational effects.

According to a configuration described above, the heat conductor portion of the heat conductor path is arranged in the inner space in which the piezoelectric resonator is hermetically sealed, and therefore the temperature of the piezoelectric resonator can be accurately detected and the piezoelectric resonator can be effectively radiated with heat. In other words, the piezoelectric resonator is effectively radiated with heat on the basis of accurate changes in temperature, and therefore temperature control can be appropriately performed on the piezoelectric resonator. In addition, the heat conductor path is employed in both a temperature-detecting function using the temperature sensor and a heat-radiating function using the heating element, and therefore space can be saved in a pattern formation region, and a reduction in the size of the piezoelectric resonator unit can be realized.

According to a configuration described above, the heat conductor portion is formed on part of the first surface of the substrate that overlaps part of the piezoelectric resonator, and therefore the heat conductor portion can be arranged close to the piezoelectric resonator and the performances of the heat-radiating function and the temperature-detecting function of the heat conductor portion can be improved.

According to a configuration described above, the piezoelectric resonator, the lid member, and the base member are all formed of a crystal, and therefore the heat conductor portion of the heat conductor path can be formed using the same material as the target of temperature detection and temperature detection accuracy can be improved.

According to a configuration described above, the heat conductor portion is formed on a frame body, a connection portion, or a crystal blank of the crystal resonator, and therefore the heat conductor portion can be formed so as to be close to the crystal blank, which is the target of temperature detection. Therefore, a more accurate temperature can be detected and heat can be more effectively radiated.

The dimensions, shapes, directions, and so forth of the individual parts described above are not necessarily exact regardless of whether words such as "approximately", "substantially", "practically", etc. are applied, and include equivalents as understood by one skilled in the art.

The purpose of the embodiments described above is to enable easy understanding of the present invention and the embodiments are not to be interpreted as limiting the present invention. The present invention can be modified or improved without departing from the gist of the invention and equivalents to the present invention are also included in the present invention. In other words, appropriate design changes made to the embodiments by one skilled in the art are also included in the scope of the present invention so long as the changes have the characteristics of the present invention. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present invention so long as the combined elements have the characteristics of the present invention.

REFERENCE SIGNS LIST 1 piezoelectric resonator unit
2 crystal resonator unit (piezoelectric resonator unit)
10 piezoelectric resonator
20 cap (lid member)
23 inner space
30 substrate (base member)
32a first surface (mounting surface)
32b second surface
36a electrically conductive holding member
36b electrically conductive holding member
38 heat conductor
38a heat conductor portion
54a oscillation circuit
54b temperature sensor
54c heating element
54d control circuit
60 piezoelectric oscillator
50 integrated circuit element (electronic component)
70 heat conductor
72 first heat conductor portion
74 second heat conductor portion
80 circuit board
90 piezoelectric oscillator
102 crystal blank
104 frame body
110 crystal resonator
114a first excitation electrode 114b second excitation electrode
118a connection portion
118b connection portion

The invention claimed is:
1. A piezoelectric resonator unit, comprising:
a base having first and second opposed main surfaces;
a piezoelectric resonator mounted on the second main surface of the base;
a lid which is bonded to the base to form an inner space in which the piezoelectric resonator is hermetically sealed;
a temperature sensor located outside of the inner space;
a heating element located outside of the inner space; and
a heat conductor that extends through the base from the first main surface to the second main surface and provides a thermal connection between the inner space and both the temperature sensor and the heating element such that the heat conductor can apply heat to the inner space and the temperature sensor can sense the temperature of the inner space via the heat conductor, the heat conductor extending over a portion of the second main surface of the base which overlaps the piezoelectric resonator and not being electrically connected to the piezoelectric resonator.

2. The piezoelectric resonator unit according to claim 1, wherein:
the piezoelectric resonator is mounted on the second main surface of the base member via an electrically conductive holding member; and
the heat conductor is not in physical contact with the electrically conductive holding member.

3. The piezoelectric resonator unit according to claim 2, wherein the piezoelectric resonator is a crystal resonator.

4. The piezoelectric resonator unit according to claim 1, wherein the piezoelectric resonator is a crystal resonator.

5. The piezoelectric resonator unit according to claim 4, wherein the base and the lid are each composed of a crystal material.

6. The piezoelectric resonator unit according to claim 5, wherein the piezoelectric resonator includes:
a crystal blank having a main surface;
an excitation electrode formed on the main surface of the crystal blank; and
a frame body that surrounds an outer periphery of the crystal blank and is connected to the crystal blank by a connection portion.

7. The piezoelectric resonator unit according to claim 6, wherein the heat conductor includes a portion that is located on the connection portion in the inner space.

8. The piezoelectric resonator unit according to claim 6, wherein the heat conductor includes a portion that is located on the crystal blank in the inner space.

9. The piezoelectric resonator unit according to claim 4, wherein the crystal resonator includes:
a crystal blank having a main surface;
an excitation electrode formed on the main surface of the crystal blank; and
a frame body that surrounds an outer periphery of the crystal blank and is connected to the crystal blank by a connection portion.

10. The piezoelectric resonator unit according to claim 9, wherein the heat conductor includes a portion that is located in on the frame body in the inner space.

11. The piezoelectric resonator unit according to claim 9, wherein the heat conductor includes a portion that is located on the connection portion in the inner space.

12. The piezoelectric resonator unit according to claim 9, wherein the heat conductor includes a portion that is located on the crystal blank in the inner space.

13. A method for controlling the temperature of the piezoelectric resonator unit according to claim 1, the method comprising:
(a) detecting a temperature of the piezoelectric resonator via the heat conductor using the temperature sensor;
(b) determining an amount of heat to be supplied to the heat conductor by the heating element on the basis of the temperature detected in (a); and
(c) radiating heat onto the piezoelectric resonator via a portion of the heat conductor located in the inner space using the heating element on the basis of the amount of heat to be supplied determined in (b).

14. The piezoelectric resonator unit according to claim 1, wherein:
the piezoelectric resonator includes an excitation electrode facing the second main surface of the base; and
the portion of the heat conductor located on the second main surface of the base overlaps the entire excitation electrode.

15. The piezoelectric resonator unit according to claim 1, wherein the heat conductor is both thermally and electrically connected to the temperature sensor and the heating element.

16. A piezoelectric resonator unit, comprising:
a base having a mounting surface;
a piezoelectric resonator mounted on the mounting surface;
a lid which is bonded to the base such that the piezoelectric resonator is hermetically sealed in an inner space;
a temperature sensor located outside of the inner space;
a heating element located outside of the inner space; and
a heat conductor that extends from a position outside of the inner space to a position in the inner space to provide a thermal connection to both the temperature sensor and the heating element so that the heat conductor can apply heat to the inner space and the temperature sensor can sense the temperature of the inner space,
wherein:
the piezoelectric resonator is comprises a piezoelectric material; and
the lid and the base are formed of the piezoelectric material.

17. The piezoelectric resonator unit according to claim 16, wherein the heat conductor is formed on either the lid member or the base member.

18. The piezoelectric resonator unit according to claim 17, wherein the piezoelectric material is a crystal material.

19. The piezoelectric resonator unit according to claim 1, wherein the piezoelectric resonator has a principal surface facing the second main surface of the base and the heat conductor includes a portion located between the principal surface of the piezoelectric resonator and the second surface of the base.

20. A piezoelectric resonator unit, comprising:
a base having a mounting surface;
a piezoelectric crystal resonator mounted on the mounting surface;
a lid which is bonded to the base such that the piezoelectric resonator is hermetically sealed in an inner space;
a heat conductor that extends from a position outside of the inner space to a position in the inner space to provide a thermal connection to a temperature sensor and a heating element so that when the temperature sensor and the heating element are connected to the heat conductor from a position outside of the inner space, the heat conductor can apply heat to the inner space and the temperature sensor can sense the temperature of the inner space; and wherein:

the base and the lid are each composed of a crystal material; and the crystal resonator includes:
- a crystal blank having a main surface of the crystal blank;
- an excitation electrode formed on the main surface; and
- a frame body that surrounds an outer periphery of the crystal blank and is connected to the crystal blank by a connection portion.

21. The piezoelectric resonator unit according to claim 20, wherein the heat conductor includes a portion that is located on the frame body in the inner space.

22. The piezoelectric resonator unit according to claim 20, wherein the heat conductor includes a portion that is located on the connection portion in the inner space.

23. The piezoelectric resonator unit according to claim 20, wherein the heat conductor includes a portion located on the crystal blank in the inner space.

24. A piezoelectric resonator unit, comprising:
a base having a mounting surface;
a piezoelectric resonator mounted on the mounting surface;
a lid which is bonded to the base such that the piezoelectric resonator is hermetically sealed in an inner space;
a heat conductor that extends from a position outside of the inner space to a position in the inner space to provide a thermal connection to a temperature sensor and a heating element so that when the temperature sensor and the heating element are connected to the heat conductor from a position outside of the inner space, the heat conductor can apply heat to the inner space and the temperature sensor can sense the temperature of the inner space; and wherein:
the piezoelectric resonator is a crystal resonator and includes:
  a crystal blank having a main surface;
  an excitation electrode formed on the main surface of the crystal blank; and
  a frame body surrounds an outer periphery of the crystal blank and is connected to the crystal blank by a connection portion.

25. The piezoelectric resonator unit according to claim 24, wherein the heat conductor includes a portion that is located on the frame body in the inner space.

26. The piezoelectric resonator unit according to claim 24, wherein the heat conductor includes a portion that is located on the connection portion in the inner space.

27. The piezoelectric resonator unit according to claim 24, wherein the heat conductor includes a portion that is located on the crystal blank in the inner space.

28. A piezoelectric resonator unit, comprising:
(a) a base having first and second opposed main surfaces;
(b) a piezoelectric crystal resonator mounted on the second main surface of the base, the piezoelectric crystal resonator comprising:
  (i) a crystal blank having a main surface;
  (ii) an excitation electrode formed on the main surface of the crystal blank; and
  (iii) a frame body that surrounds an outer periphery of the crystal blank and is connected to the crystal blank by a connection portion;
(c) a lid which is bonded to the base to form an inner space in which the piezoelectric crystal resonator is hermetically sealed;
(d) a temperature sensor located outside of the inner space;
(e) a heating element located outside of the inner space; and
(f) a heat conductor that extends through the base from the first main surface to the second main surface and provides a thermal connection between the inner space and both the temperature sensor and the heating element such that the heat conductor can apply heat to the inner space and the temperature sensor can sense the temperature of the inner space via the heat conductor, the heat conductor not being electrically connected to the piezoelectric resonator.

29. The piezoelectric resonator unit according to claim 28, wherein the base member and the lid member are each composed of a crystal material.

30. A piezoelectric resonator unit, comprising:
a base having first and second opposed main surfaces;
a piezoelectric resonator mounted on the second main surface of the base;
a lid which is bonded to the base to form an inner space in which the piezoelectric resonator is hermetically sealed;
a temperature sensor located outside of the inner space;
a heating element located outside of the inner space; and
a heat conductor that extends through the base from the first main surface to the second main surface of the base and provides a thermal connection between the inner space and both the temperature sensor and the heating element such that the heat conductor can apply heat to the inner space and the temperature sensor can sense the temperature of the inner space via the heat conductor, the heat conductor not being electrically connected to the piezoelectric resonator, the heat conductor being both thermally and electrically connected to the temperature sensor and the heating element.

* * * * *